United States Patent
Hurrell et al.

(10) Patent No.: US 7,218,259 B2
(45) Date of Patent: May 15, 2007

(54) ANALOG-TO-DIGITAL CONVERTER WITH SIGNAL-TO-NOISE RATIO ENHANCEMENT

(75) Inventors: Christopher Peter Hurrell, Cookham (GB); Gary Robert Carreau, Plaistow, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/266,071

(22) Filed: Nov. 3, 2005

(65) Prior Publication Data

US 2007/0035431 A1 Feb. 15, 2007

Related U.S. Application Data

(60) Provisional application No. 60/708,057, filed on Aug. 12, 2005.

(51) Int. Cl.
*H03M 1/06* (2006.01)

(52) U.S. Cl. ............... 341/118; 341/120; 341/150; 341/161; 341/163; 341/172

(58) Field of Classification Search ............... 341/172
See application file for complete search history.

(56) References Cited

U.S. PATENT DOCUMENTS

| | | | |
|---|---|---|---|
| 3,956,708 A | 5/1976 | Musa | |
| 4,129,863 A * | 12/1978 | Gray et al. | 341/172 |
| 4,200,863 A * | 4/1980 | Hodges et al. | 341/156 |
| 4,320,347 A | 3/1982 | Haque | |
| 4,399,426 A * | 8/1983 | Tan | 341/120 |
| 4,620,179 A | 10/1986 | Cooper et al. | |
| 4,769,755 A | 9/1988 | Yamakawa | |
| 4,799,042 A * | 1/1989 | Confalonieri et al. | 341/118 |
| 4,831,381 A | 5/1989 | Hester | |
| 4,907,002 A | 3/1990 | Kawada | |
| 4,940,981 A | 7/1990 | Naylor et al. | |
| 4,945,359 A | 7/1990 | Yamakido | |
| 4,999,628 A | 3/1991 | Kakubo et al. | |
| 4,999,633 A * | 3/1991 | Draxelmayr | 341/120 |
| 5,010,339 A | 4/1991 | Giangano et al. | |
| 5,247,299 A | 9/1993 | Lim et al. | |
| 5,272,481 A | 12/1993 | Sauer | |
| 5,313,206 A | 5/1994 | Davies et al. | |
| 5,416,484 A | 5/1995 | Lofstrom | |

(Continued)

FOREIGN PATENT DOCUMENTS

EP 0406973 1/1991

OTHER PUBLICATIONS

PCT/US2006/030503, International Search Report and Written Opinion, Nov. 21, 2006.

(Continued)

*Primary Examiner*—Khai M. Nguyen
(74) *Attorney, Agent, or Firm*—Wolf, Greenfield & Sacks, P.C.

(57) ABSTRACT

A method of operating a digital to analog converter comprising the steps of operating the converter in a first mode to obtain a first conversion result, operating the converter in a correction mode in which one or more correction conversions are made, and wherein each correction conversion takes the result of a preceding result as a valid starting point.

25 Claims, 6 Drawing Sheets

U.S. PATENT DOCUMENTS

| | | | |
|---|---|---|---|
| 5,581,252 A | 12/1996 | Thomas | |
| 5,621,409 A | 4/1997 | Cotter et al. | |
| 5,633,639 A | 5/1997 | Hopkins | |
| 5,684,487 A * | 11/1997 | Timko | 341/172 |
| 5,852,415 A | 12/1998 | Cotter et al. | |
| 5,870,052 A | 2/1999 | Dedic et al. | |
| 5,889,486 A * | 3/1999 | Opris et al. | 341/150 |
| 5,990,948 A | 11/1999 | Sugiki | |
| 6,104,329 A | 8/2000 | Kawano | |
| 6,239,734 B1 | 5/2001 | Bae et al. | |
| 6,351,231 B1 | 2/2002 | Price et al. | |
| 6,424,276 B1 | 7/2002 | Munoz et al. | |
| 6,448,911 B1 * | 9/2002 | Somayajula | 341/120 |
| 6,476,749 B1 | 11/2002 | Yeap et al. | |
| 6,489,904 B1 | 12/2002 | Hisano | |
| 6,515,606 B2 | 2/2003 | Lyden | |
| 6,518,907 B2 | 2/2003 | Tsai | |
| 6,600,437 B1 * | 7/2003 | Confalonieri et al. | 341/150 |
| 6,608,580 B2 | 8/2003 | Hsueh | |
| 6,614,373 B1 | 9/2003 | Frazier | |
| 6,646,583 B1 | 11/2003 | Fossum et al. | |
| 6,664,911 B2 | 12/2003 | Hirai | |
| 6,683,550 B2 | 1/2004 | Al-Awadhi | |
| 6,686,865 B2 * | 2/2004 | Confalonieri et al. | 341/172 |
| 6,703,961 B2 | 3/2004 | Mueck et al. | |
| 6,731,232 B1 | 5/2004 | Kearney | |
| 6,734,817 B2 | 5/2004 | Naka et al. | |
| 6,747,522 B2 | 6/2004 | Pietruszynski et al. | |
| 6,784,814 B1 | 8/2004 | Nair et al. | |
| 6,828,927 B1 | 12/2004 | Hurrell et al. | |
| 6,850,181 B1 | 2/2005 | Tsinker | |
| 6,864,874 B1 | 3/2005 | Ozawa | |
| 6,894,627 B2 | 5/2005 | Janakiraman et al. | |
| 6,914,550 B2 | 7/2005 | Cai | |
| 6,999,018 B2 | 2/2006 | Aeby et al. | |
| 7,015,853 B1 | 3/2006 | Wolff et al. | |
| 7,023,372 B1 | 4/2006 | Singh et al. | |
| 7,026,975 B1 | 4/2006 | Steward et al. | |
| 7,038,609 B1 | 5/2006 | Hurrell | |
| 2003/0123646 A1 | 7/2003 | Srinivasan et al. | |
| 2003/0179124 A1 | 9/2003 | Harada | |
| 2006/0208935 A1 | 9/2006 | Hurrell et al. | |
| 2006/0208937 A1 | 9/2006 | Hurrell et al. | |

OTHER PUBLICATIONS

Bhandari, S., et al., "A successive double-bit approximation technique for analog/digital conversion", IEEE Transactions on Circuits and Systems, vol. 37, No. 6, Jun. 1990, pp. 856-858.

* cited by examiner

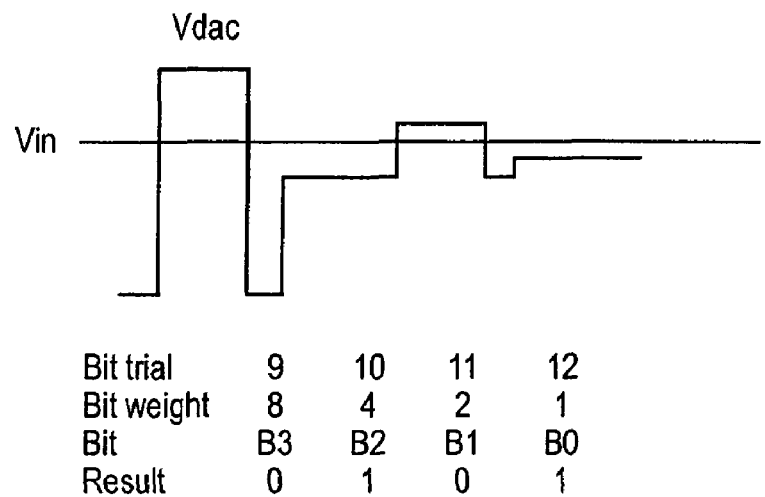
Fig. 2. Last 4 bit trials of conventional 12-bit SAR ADC
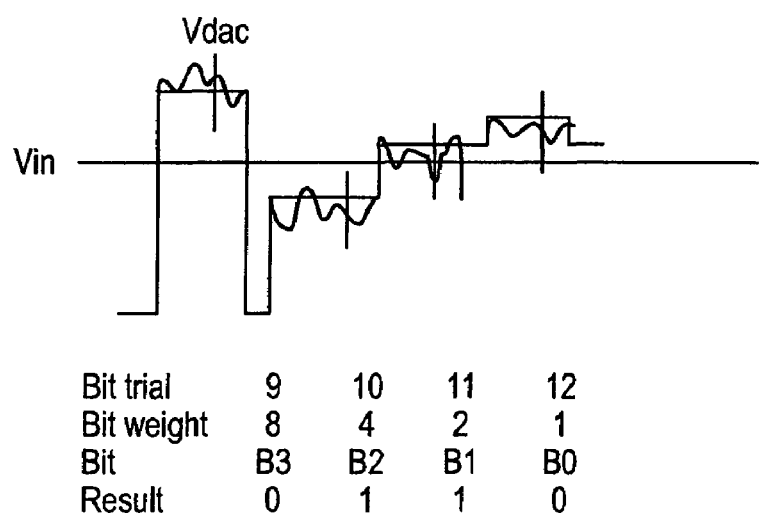
Fig. 3. Last 4 bit trials of conventional 12-bit SAR ADC with noise superimposed on DAC Fig. 6. Proposed SAR ADC with 3 correction bits

ANALOG-TO-DIGITAL CONVERTER WITH SIGNAL-TO-NOISE RATIO ENHANCEMENT

FIELD OF THE INVENTION

The present invention relates to an analog to digital converter, and more particularly to an analog to digital converter including circuitry for increasing the signal to noise ratio by obtaining multiple conversion results without causing a proportionate reduction in throughput.

PROBLEM ADDRESSED

In an ideal noiseless world an analog signal presented to a digital to analog converter would be capable of accurate digitisation to whatever resolution the designer of the converter desired. However, in the real world, the performance of an analog to digital converter is constrained by many factors. One of these constraining factors is self generated noise within the analog to digital converter. Many analog to digital converters use a switched capacitor array to perform the dual function of acting as a sampling capacitor, and also acting as a digital to analog converter during a successive approximation analog to digital conversion.

The signal to noise ratio, SNR, of an analog-to-digital successive approximation (SAR) converter is determined largely by kT/C noise, generated by the switched capacitor array and associated switches and by the noise in the comparator preamplifier that follows the capacitor array. kT/C noise can be reduced by using larger capacitors. However this is not always appropriate as larger capacitors take up more area within an integrated circuit and take longer to sample the input signal as they cause larger glitches at the circuits driving the ADC, and these circuits then take longer to settle. Decreasing the noise of the comparator preamplifiers has required the use of higher preamplifier bias current and often larger preamplifier input devices. It is therefore desirable to find a way of improving the signal to noise performance of an analog to digital converter without significantly increasing the preamplifier bias current levels.

SUMMARY OF THE INVENTION

According to a first aspect of the present invention there is provided a method of operating an analog to digital converter comprising the steps of operating the converter in a first mode to obtain a first conversion result, operating the converter in a correction mode in which at least one correction conversion is made, and combining the first conversion result and the or each correction conversion and wherein each correction conversion takes the result of a preceding result as a valid starting point.

It is thus possible to provide an analog to digital converter which can make multiple conversion results so as to allow the signal to noise ratio of the converter to improve, without incurring a significant time penalty and hence loss of throughput.

Advantageously the analog to digital converter is a successive approximation converter. Various successive approximation converter topologies are known to the person skilled in the art and the present invention is susceptible to being used with any one of them.

Preferably multiple correction conversions are made, with each correction conversion taking the preceding conversion result as a starting point.

A normal SAR conversion ends when the least significant bit, LSB, is determined. This represents a first trial. In the present invention, a number N of additional bits are also determined. Each additional bit represents a correction trial. In an exemplary embodiment, each additional bit has an effective weight of +/−0.5, though different weightings could be used. The conversion result after the last bit of the normal (first) bit trial plus the result after each additional correction bit trial is considered as a valid result. Consecutive results in this example differ by +/−0.5 LSB. The final result is achieved by adding together the (N+1) results. Since the (N+1) results are determined at different instances, the effect of comparator noise is reduced. An additional benefit of this method is that a higher resolution result is obtained. For example, a 16-bit converter followed by three additional +/−0.5 bits correction bit trials can result in an 18-bit conversion result when the four results are added together.

According to a second aspect of the present invention there is provided an analog to digital converter arranged to operate in a first mode to obtain a first conversion result, and to operate in a correction mode so as to perform at least one correction conversion and to combine the first conversion and the or each correction conversions, and where each conversion takes a preceding conversion as a valid starting point.

BRIEF DESCRIPTION OF THE FIGURES

Embodiments of the present invention will now be described, by way of non-limiting example only, with reference to the accompanying Figures, in which:

FIG. 2 schematically illustrates the last four bit trials performed within a conventional 12 bit successive approximation converter;

FIG. 3 illustrates the last four bit trials of a conventional successive approximation analog to digital converter with noise superimposed on a digital to analog converter therein;

DESCRIPTION OF EMBODIMENTS OF THE INVENTION

Figure 1:
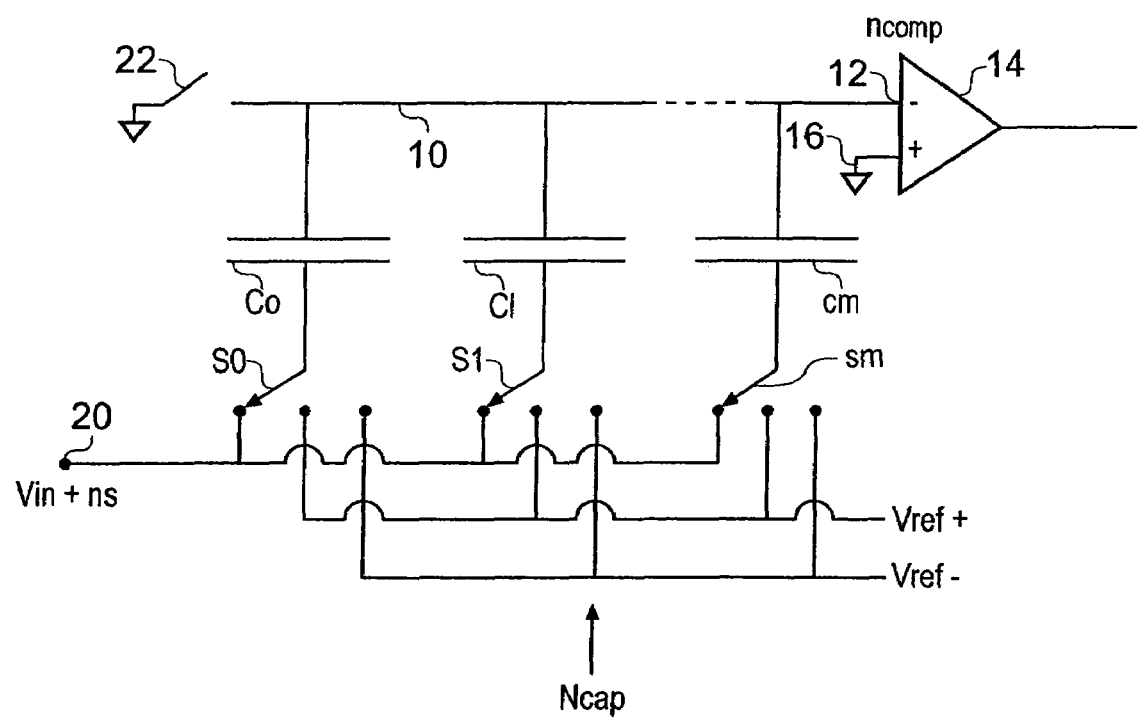
FIG. 1 schematically illustrates part of the input stage of a switched capacitor based analog to digital converter.

FIG. 1 schematically illustrates the input stage of a switched capacitor analog to digital converter. In general the input stage comprises m capacitors C0 to Cm which have one of their plates (the uppermost plate as shown in FIG. 1) connected to a common conductor 10 which is connected to the inverting input 12 of a comparator 14. A non-inverting input 16 of the comparator 14 is connected to ground. Each of the second plates (the lowermost plates as shown in FIG. 1) of the capacitors C0 to Cm is connected to a respective electronic switch S0 to Sm. The switches S0 to Sm are individually controllable to connect their associated capacitor to an input node 20 such that the capacitors can be charged to an input voltage Vin. The capacitors C0 to Cm can also be switched to either a positive reference voltage Vref+ or a negative reference voltage Vref− which typically is the ground voltage. The conductor 10 can also be connected to ground by an electronically controllable switch 22 which is closed (i.e. placed in a low impedance state) when it is desired to sample the input voltage Vin onto the capacitors C0 to Cm. For convenience, we may assume the capacitors C0 to Cm are binary weighted such that capacitor C0 has a value of $2^0$ capacitance units, capacitor C1 has a value $2^1$ capacitance units and so on up to Cm which has a value of $2^m$ capacitance units.

In use, switch 22 is closed and switches S0 to Sm are switched to a first position where they connect the capacitors to the input node 20. The capacitors C0 to Cm then charge up to the input voltage Vin. Switch 22 is then opened thereby capturing the charge on the capacitors C0 to Cm. The successive approximation search can then be initiated. All the switches S0 to Sm are switched to connect the capacitors to the Vref− reference voltage. Next the most significant capacitor Cm is tested and its switch Sm is used to connect it to the voltage reference Vref+. In practise these two switching operations can be performed in a single step. The capacitors effectively act to form a capacitive potential divider and consequently the voltage occurring at the inverting input 12 changes. The comparator 14 tests whether the voltage is greater or less than the voltage occurring at the inverting input and depending on the results of the comparison the bit corresponding to capacitor Cm is either kept (that is set) or discarded (reset). If the analog value is in the upper half of the analog to digital conversion range, then the bit Cm will be kept otherwise it will be discarded. The result of the first bit trial is carried forward to the next most significant bit, Cm-1 which is then set and tested in a similar way.

Thus a prior art SAR converter uses a binary search method to determine a digital equivalent of the analog input voltage. FIG. 2 shows an example of the last four bit trials of a traditional 12-bit converter. Whenever the DAC output, as determined by connecting selected ones of the capacitor C0 to Cm to Vref is larger than the analog input, the bit is rejected, otherwise it is kept. In both cases the next most significant bit is tried next. In the example shown in FIG. 2 the least significant bit is B0 corresponding to capacitor C0 and so. For a 12 bit converter bit B0 is the $12^{th}$ trial, bit B1 is the $11^{th}$ trial and so on. In the example bit B3 is rejected as the DAC output Vdac is then larger than the input voltage Vin. Bit B2 is kept as Vdac is then less than Vin. Bit B1 is then rejected as Vdac is greater than Vin and finally bit B0 is kept as Vdac is then less than Vin. The binary value of the last four bits is then 0101 [5 in decimal].

The result of comparator thermal noise or other non-sampled noise source may make the comparator 14 make the wrong decision. The comparator 14 is in effect performing the function of comparing the magnitude of the DAC voltage with the sampled input voltage. Due to thermal noise, mainly from the comparator input devices, the comparator can make a wrong decision. The effect of this is considered in FIG. 3. The effect of comparator noise is equivalent to noise being added to the DAC as is shown in FIG. 3. The vertical lines show the points in time where the comparator makes a decision. During bit trial 11 the DAC voltage (with noise superimposed) is less than Vin at the compare instant, resulting in bit B11 being erroneously kept. Even though bit B0 is then correctly rejected, the DAC ends up at a value larger than Vin. The final value of 0110 [6 in decimal] is then in error. Because the noise sources have different values during each conversion, the ADC will most like produce different digital results for a fixed input.

How to Reduce the Noise of an ADC

An obvious way to reduce the noise is just to average a number of results. But this also has a dramatic affect on the conversion rate. Clearly if we average, say, 4 results together to produce one output result, we have reduced the conversion rate by a factor of 4. This is therefore not an efficient way of reducing noise.

U.S. Pat. No. 6,894,627 proposes a solution where the successive approximation converter is provided with a second sub-array of binary weighted bits. In use the primary array of the converter performs a normal successive approximation conversion. Thus, as in the present example, forming a 12 bit result takes twelve conversions. At the end of the conversion it calculates an analog residual value by subtracting the digitally converted result from the sampled analog value and this residue result is sampled onto the sub-array. The sub-array only has a smaller number of capacitors, for example 5 as suggested in FIG. 8 of U.S. Pat. No. 6,894,627. The sub-array then operates in a conventional successive approximation search to produce a further conversion result. Thus to get two results now takes the time to perform 12+5=17 bit trials. Multiple conversions with the sub-array are envisaged. Therefore, in order to obtain a total of four results to be averaged together the converter described in U.S. Pat. No. 6,894,627 performs a first conversion taking 12 bit trials, and three sub-conversions each taking at least 5 bit trials, thereby resulting in four conversions taking (3*5)+12=27 bit trials. This gives an approximate two times increase in throughput compared to averaging four complete 12 bit conversions.

Whilst this is a significant improvement, the inventors have realised that faster throughput is possible given that, in a properly designed analog to digital converter the self induced converter noise will only, at worst, be equivalent to one of the smaller bit values if not less than the least significant bit.

Figure 4:
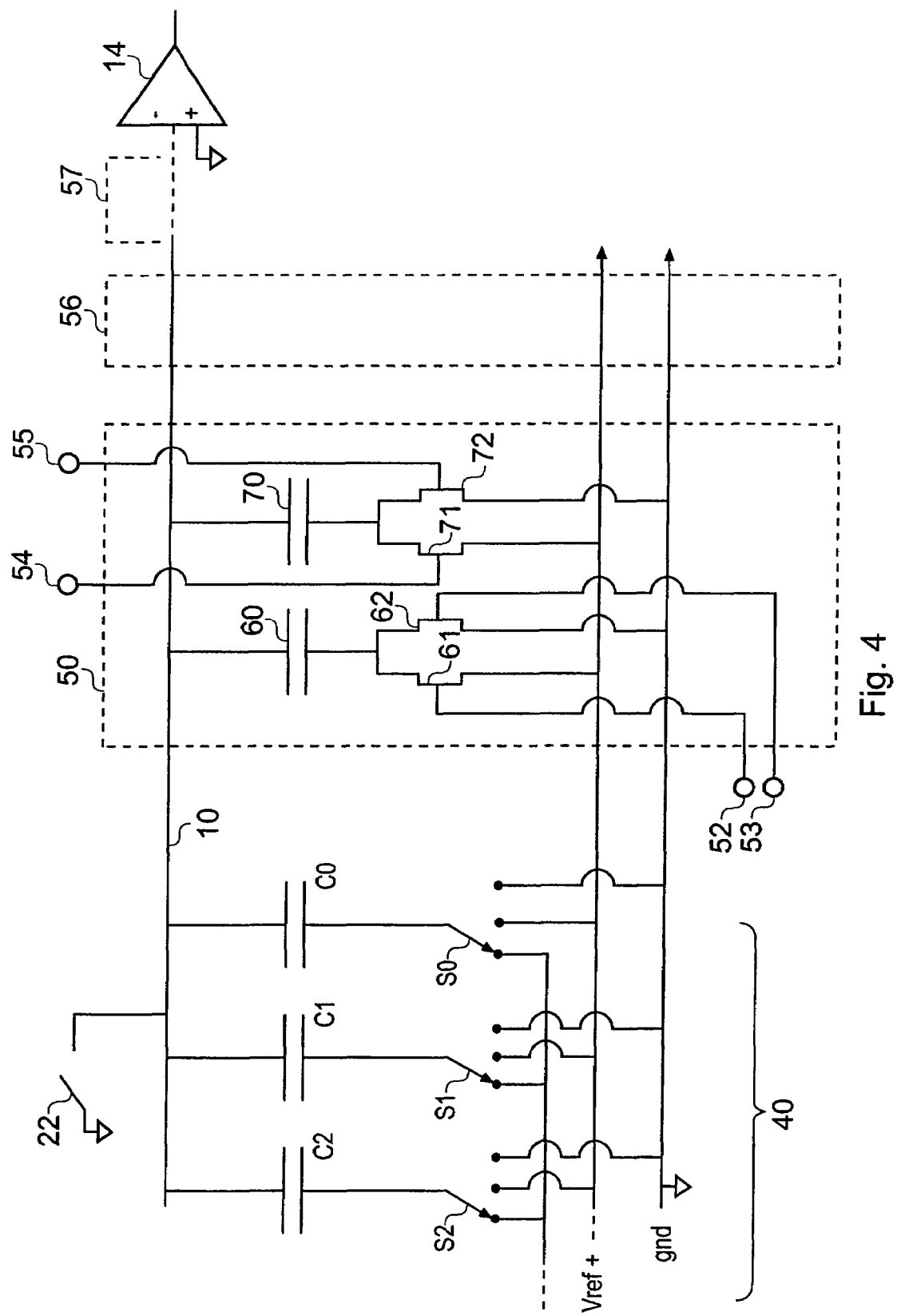
FIG. 4 schematically illustrates a switched capacitor analog to digital converter input array constituting an embodiment of the present invention.

The inventors have realised that improved SNR performance can be achieved by adding a number of additional correction bit trials after the normal LSB bit trial. In the preferred embodiment, each correction bit has a weight of 1 with a fixed offset of −½ so as to give correction weights of $\Delta C = \pm ½$ LSB. This modified array is shown in FIG. 4. The left hand most portion of FIG. 4, generally designated 40, corresponds to the arrangement of the sampling capacitors shown in FIG. 1. However a plurality of correction capacitors having a value of 1 LSB offset by minus 0.5 LSB are also fabricated, and one of these units is designated 50. This composite correction capacitor 50 is in fact formed by two individual capacitors 60 and 70. The capacitors are in series with individual switches which in this example are shown as being implemented by field effect transistors. The capacitor 60 is fabricated with the value of 1 LSB whilst the capacitor 70 is fabricated with the value of 0.5 LSB. This could be achieved by fabricating two 1 LSB capacitors in series. The bottom plate of the capacitor 60 can be connected to Vref+ via field effect transistor 61 and to ground by field effect transistor 62. Similarly the bottom plate of the capacitor 70 can be connected to Vref+ via transistor 71 and to ground via transistor 72. Each transistor 61, 62, 71 and 72 is individually controllable via respective gate terminal inputs 52, 53, 54 and 55. A plurality of other correction bits 56, 57 and so on implemented in the same way as bit 50 are provided. It can be seen that, for simplicity, the input voltage is not sampled onto these correction bit capacitors. This does not adversely effect the linearity of the analog to digital converter. Although for simplicity of the explanation of the operation of the ADC the correction capacitors 50, 56, 57 and associated switches 61, 62, 71 and 72 have been considered as being part of the main array, in practice a high resolution converter is likely to be implemented as a segmented converter. As a consequence the bits of lower significance and the correction bits or correction capacitors are likely to reside in a sub array. The use of a segmented architecture is well known to the person skilled in the art, as is the fact that it is not necessary to sample onto the sub array.

Figure 5:
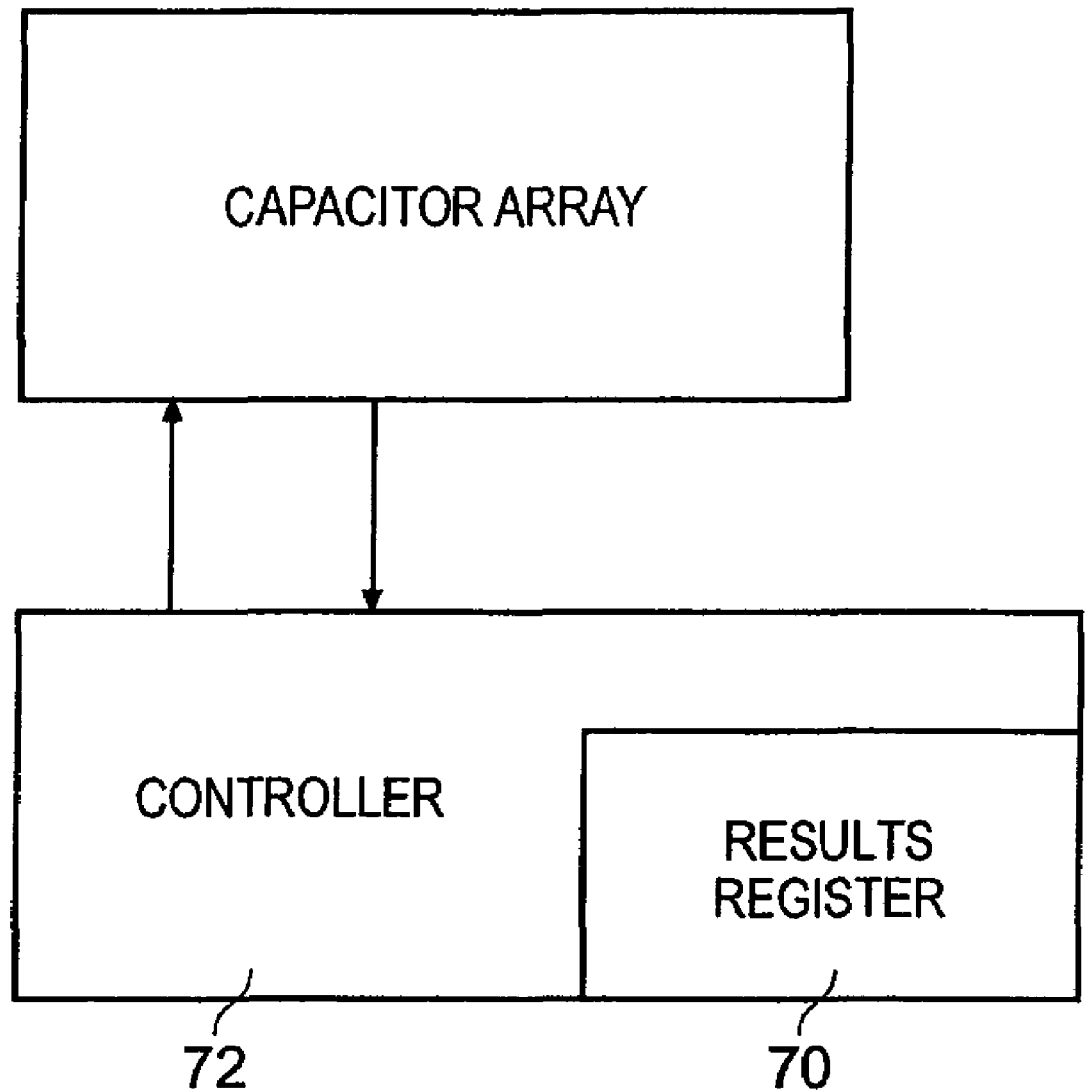
FIG. 5 shows a SAR converter having a controller having a result register therein for storing a plurality of conversion results.

Assuming that the input voltage Vin is not sampled onto the correction capacitors, during the sampling phase switch 22 is closed and the control line 52 is held low so that the transistor 61 is non-conducting. Simultaneously control line 53 is held high/active so that transistor 62 is conducting. It can be seen that the transistors are acting as switches, so if we refer to them as switches then switch 61 is open and switch 62 is closed. Simultaneously signals on control lines 54 and 55 are set such that switch 71 is closed and switch 72 is open. Therefore capacitor 60 is connected between the common rail 10 and ground whereas capacitor 70 is connected between the common rail 10 and Vref+. Once switch 22 is opened these capacitors retain their charges. The analog to digital converter is then operated as normal to perform a P bit successive approximation conversion for its bits Bm to B0 as described with reference to FIGS. 1 and 2. P typically equals 12 for a 12 bit converter and uses bits B11 to B0. Once the successive approximation conversion has been completed, the converted result is passed to a results register 70 within a controller 72 which controls the operation of the various switches within the analog to digital conversion core (FIG. 5). Once the result of a first trial has been determined the converter now enters a correction mode in which the individual correction bits are tested. Thus, the first bit 50 is set by closing switch 61, opening switch 62, opening switch 71 and closing switch 72. This switches capacitor 60 from ground to Vref+ inserting a weight of 1 LSB into the capacitor array whilst switching capacitor 70 from Vref to ground, thereby inserting an effective weight of −½ LSB into the array giving a weight change of 0.5 LSB. The result if then tested by the comparator 14 and the bit is either kept or discarded as appropriate. If the result is to be kept, i.e. +0.5 LSB is added to the digital result, then the switches are maintained in their current state, i.e. switch 61 and 72 closed, whereas switches 62 and 71 are open.

Figure 6:
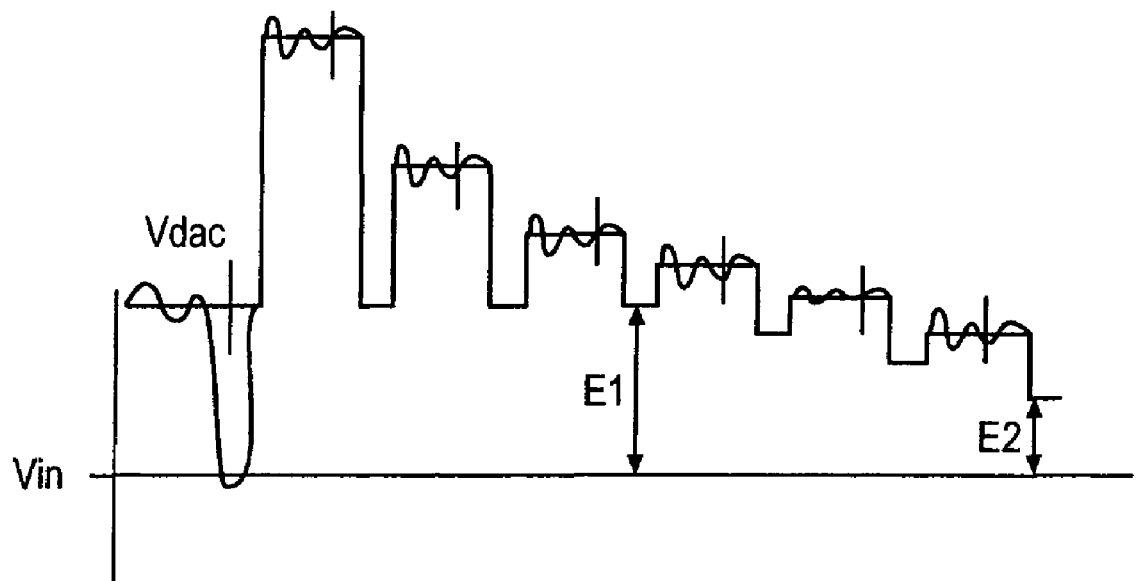
FIG. 6 schematically illustrates the last four bits of a bit trial plus the conversion of three correction bits within an analog to digital converter constituting an embodiment of the present invention.

If the result is to be discarded then we wish to subtract 0.5 LSB from the digital word. To do this switches 61 and 62 are operated such that switch 61 is open and switch 62 is closed. Switches 71 and 72 are not altered. What this means is that when the bit is set, the DAC is incremented by ½, but if this bit is then rejected, the DAC decrements by 1, resulting in a net change of −½. The effect of each correction bit trial is to allow the ADC to reduce the DAC error if a large noise event (of either sign) has caused a wrong decision to be made on a previous bit trial. FIG. 6 shows an example where 3 extra correction bits C1–3 have been added. In this case a large noise event during bit trial 9, results in this bit being erroneously kept. Bits B2, B1 and B0 are all subsequently rejected but an error E1 remains at the end of the normal conversion. However, after each extra additional correction bit trial, the error reduces.

It is possible to provide similar but alternative switching schemes. Returning to FIG. 4, capacitors 60 and 70 could both be fabricated with a magnitude of ½ C, and we use them such that capacitor 60 has a weight of +0.5 LSB and capacitor 70 has a weight of −0.5 LSB.

Thus, during sampling we have switch 61 open, switch 62 closed, switch 71 closed and switch 72 open.

To test the correction bit switch 61 is closed and switch 62 is opened. Switch 71 remains closed and switch 72 remains open.

If the result of the comparison is to keep the bits then the switches are left in this configuration. If the bit is to be rejected then switch 61 is opened, switch 62 is closed, switch 71 is opened and switch 72 is closed.

How to Make the Most of These Additional Correction Bits

An ADC result could be obtained by adding all the set weights in the example of FIG. 6. (The rejected correction bits have to be treated as worth −½ LSB each). The final correction result then is then 8−½−½−½=6.5. This is clearly closer to the correct value of 5 than the uncorrected value of 8, if we had stopped at the normal LSB bit B0.

However, although in this case the correction bits allowed some recovery from a previous very large noise event, these correction bits themselves are prone to noise. As a result, it turns out that just adding up the bit weights conveys only a small noise advantage.

Instead, we treat the result after the LSB and each additional correction result as a valid result. The final result is then obtained by adding the 4 interim results together.

This works because each interim result only provides ¼ of the final answer. The effect of any noise peak occurring during any one of the last 4 bit trials is therefore reduced.

How the Mathematics is Done

Again, the following example shows the case of a 12-bit converter with 3 correction bits giving us 4 results to add up:

| Bit weight | $2^{11}$ | $2^{10}$ | $2^9$ | $2^8$ | $2^7$ | $2^6$ | $2^5$ | $2^4$ | $2^3$ | $2^2$ | $2^1$ | $2^0$ | $2^0$ | $2^0$ | $2^0$ |
|---|---|---|---|---|---|---|---|---|---|---|---|---|---|---|---|
| Result 1 | B11 | B10 | B9 | B8 | B7 | B6 | B5 | B4 | B3 | B2 | B1 | B0 | | | |
| Result 2 | B11 | B10 | B9 | B8 | B7 | B6 | B5 | B4 | B3 | B2 | B1 | B0 | C1 | | |
| Result 3 | B11 | B10 | B9 | B8 | B7 | B6 | B5 | B4 | B3 | B2 | B1 | B0 | C1 | C2 | |
| Result 4 | B11 | B10 | B9 | B8 | B7 | B6 | B5 | B4 | B3 | B2 | B1 | B0 | C1 | C2 | C3 |

4 * (B11 B10 B9 B8 B7 B6 B5 B4 B3 B2 B1 B0) +3C1 + 2C2 + C3 − 6/2

The value of −6/2 at the end is due to the fact that we are treating each of the 3 correction bits in the final result as having a weight of 1 with an offset of −½, but some correction bits contribute more times than others, C1 contributes 3 times, C2 twice and C1 once, and 3+2+1=6.

Each result can be treated as an independent 12 bit conversion. Therefore we have effectively gained four independent 12 bit conversions in 15 bit trials. Four 12 bit results can be added together to produce an effective 14 bit result. As a consequence the scheme proposed here has not only reduced the effect of noise but has also increased the resolution of the converter. This is advantageous because if the scheme had averaged the noise but kept the resolution the same then the noise threshold of the converter could have become limited by the quantisation noise therein. In the arrangement described herein the quantisation noise and the thermal noise are reduced together.

It should be noted that to achieve a 14 bit result, as described in the previous paragraph, actually requires a certain amount of noise. This is because in the absence of any noise the comparator would either toggle between 1 and 0 during the correction bits or between 0 and 1. This only gives enough additional information to turn the original 12 bit result into a 13 bit result. In some cases the existing thermal noise is sufficient to avoid this toggling behaviour and then a 14 bit result would result. In a small modification to the scheme described, a fixed offset can be added during the correction bits that would yield a 14 bit result even in the absence of noise. For example, with 3 extra correction bits, an offset equivalent to + or −1 LSB at the 14 bit level is introduced between the $2^{nd}$ correction bit and the $3^{rd}$ correction bit. This shift in offset then breaks up the toggle pattern so that the correction bits then provide sufficient extra information to generate a 14 bit result in the absence of any noise. This offset would be most likely introduced using switched capacitor means.

Introducing an offset to increase the resolution of the conversion has been described with the specific case of a 12 bit converter with 3 correction bits in mind. However the same concept works with different resolution converters with the same or different numbers of correction bits. It may also be desirable to add a fixed offset more than once during the correction part of the conversion.

In U.S. Pat. No. 6,894,627, even if a larger noise spike causes a fairly gross error in the first conversion, subsequent repeated conversions using the second sub array are, most likely, able to completely recover from such an error. However this may be at the cost of a number of bit trials per additional conversion. In the new scheme as described, if the original conversion is significantly in error, due to a noise event, it may take a number of additional averaging bit trails to recover from this error, as is shown in FIG. 6. However the advantage of the new scheme is that each additional conversion is obtained at the cost of only 1 extra bit trial. The inventors have demonstrated that, particular at reasonably low noise levels, this new scheme achieves a higher SNR for a given number of bit trials than the invention described in U.S. Pat. No. 6,894,627.

It is known to include redundant bits within the body of the main converter array to enable the converter to recover more easily from incorrect decisions and also to enable decisions to be made before the converter has fully settled. Such an array can be used in conjunction with the present invention. Similarly it is known that a plurality of successive approximation conversion engines can be arranged to work in a co-operative manner such that two bits can be determined at each bit trial. Again this scheme can be extended to such an analog to digital converter with either the engines working independently in the last few trials and having respective correction bits fabricated therein or alternatively the capacitor arrays of the independent conversion engines can be switched in parallel towards the end of the trial in order to perform a larger array which itself will exhibit reduced thermal noise.

Figure 7:
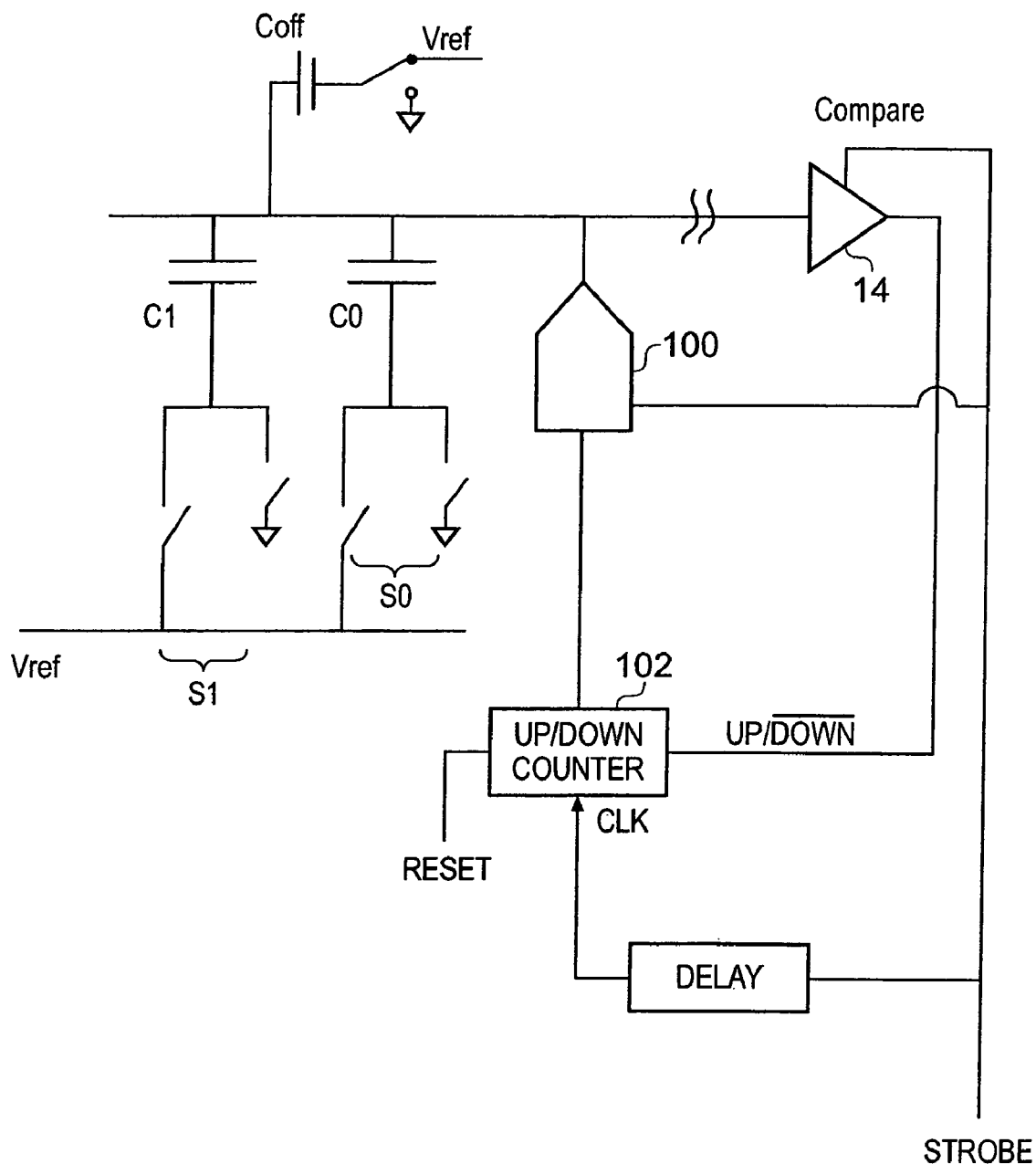
FIG. 7 illustrates a further embodiment of the invention.

FIG. 7 schematically illustrates a further embodiment of the present invention. In this embodiment a capacitor digital to analog converter 100 is attached to the capacitor array of the analog to digital converter. The DAC 100 needs to be able to count up and down and consequently a reset condition should take it to a point near its mid-range. An output of the DAC is connected to the common line 10 which, in FIG. 7, is shown as being connected to the comparator 14. in practise the DAC 100 is likely to be formed in a sub array of a segmented analog to digital converter and hence will be coupled to the comparator 14 via a further capacitor (not shown) ideally the DAC 100 has a resolution of less than 1 least significant bit of the analog to digital converter, and as before, a resolution of ½ of 1 least significant bit is appropriate. The digital to analog converter 100 is driven by an up-down counter 102 which is responsive to the output of the comparator 14. A clock or a strobe signal is used to synchronise operation of the comparator, the up-down counter 102 and the digital to analog converter 100 so as to avoid these components racing. Thus, as with the previously described embodiments, at each correction conversion the comparator can compare the current digital code with the analog input value and as a result the code will be either incremented or decremented by the step size of the digital to analog converter.

This figure also includes an offset capacitor, Coff, which is typically 0.25 LSB in size, and which can be switched between ground and Vref to apply a small offset to the sampling array so as to break the bit toggle pattern such that the correction bits provide sufficient information to provide enhanced resolution.

It is thus possible to provide an improved analog to digital converter having an improved signal to noise ratio whilst substantially maintaining conversion throughput.

The invention claimed is:

1. A method of operating an analog to digital converter comprising
   a) operating the converter in a first mode to perform a successive approximation conversion to obtain a first conversion result; and
   b) subsequently operating the converter in a correction mode in which at least one correction conversion is made to obtain a correction conversion result, and combining the first conversion result and the or each correction conversion result and wherein each correction conversion takes the result of a preceding conversion as a valid starting point, and combining the first conversion result and the or each correction conversion includes summing the or each valid result.

2. A method as claimed in claim 1, in which each correction conversion takes the result of an immediately preceding conversion as a valid starting point.

3. A method as claimed in claim 1 in which each correction conversion can only modify the immediately preceding result by a predetermined step size.

4. A method as claimed in claim 3, in which The immediately preceding result is incremented by ΔC or decremented by ΔC where ΔC is a step size of 0.5 LSB of the first conversion result.

5. A method as claimed in claim 1, where the converter operates in the first mode to obtain a first conversion result, and in the second mode performs N correction conversions where each correction conversion causes a new bit to be trialled, with all previously trailed bits being left unmodified.

6. A method as claimed in claim 1, where summing comprises averaging.

7. A method as claimed in claim 1, where each correction conversion is a single bit trial.

8. A method as claimed in claim 1, in which in the first mode the converter performs a P bit successive approximation conversion.

9. A method as claimed in claim 1, in which a plurality of correction conversions are performed.

10. A method as claimed in claim 9, in which the results from the correction conversions are summed.

11. A method of operating an analog to digital converter as claimed in claim 1, further including adding an offset while performing at least one of the correction conversions.

12. A method as claimed in claim 11, wherein the offset corresponds to less than 1 LSB size of the physical analog to digital converter.

13. A method as claimed in claim 12, wherein the offset corresponds to one half or one quarter of the LSB size of the analog to digital converter, so as to provide an increased effective resolution.

14. A method of operating an analog to digital converter, comprising operating the converter in a first mode to obtain a P bit conversion result, and operating the converter in a second mode to perform N correction conversions where each correction conversion causes an Nth bit to be trialled, with all the previously trialled bits being left unmodified, and combining the P bit conversion result and the N correction conversions by summing so as to improve a signal to noise ratio of the converter.

15. An analog to digital converter arranged
   a) to operate in a first mode to obtain a first successive approximation conversion result, and subsequently
   b) to operate in a correction mode so as to perform at least one correction conversion to obtain at least one correction conversion result, and to combine the first conversion result and the or each correction conversion result, and where each conversion takes a preceding conversion as a valid starting point, and combining the first conversion result and the or each correction conversion includes summing said the or each result.

16. An analog to digital converter as claimed in claim 15, in which each correction conversion takes an immediately preceding conversion as a valid starting point.

17. An analog to digital converter as claimed in claim 16, in which each correction conversion only modifies the immediately preceding result by a predetermined step size.

18. An analog to digital converter as claimed in claim 15, in which the correction bits are formed in a sub array.

19. An analog to digital converter as claimed in claim 15, in which the correction bits are implemented as two capacitors, a first providing a positive value and a second providing a negative value.

20. An analog to digital converter as claimed in claim 15, further comprising a capacitor DAC for providing a correction result.

21. An analog to digital converter as claimed in claim 20, in which the capacitor DAC is one of incremented and decremented depending on the output of a comparator comparing an analog sample with a digital code from the ADC representing the analog sample.

22. An analog to digital converter as claimed in claim 15, further including an offset generator for adding an offset while performing the correction conversions.

23. The converter of claim 15 wherein summing comprises averaging.

24. A method of operating an analog to digital converter, comprising:
   a) operating the converter in a first mode to perform a successive approximation conversion to obtain a first conversion result,
   b) subsequently operating the converter in a correction mode in which a first correction conversion is made and which results in a first correction value which differs from the first conversion result by plus or minus 0.5 of the least significant bit of the first conversion result,
   c) performing at least one further correction conversion which results in at least one further correction value which differs from a preceding correction value by plus or minus 0.5 of the least significant bit of the first conversion result, and
   d) combining the first conversion result and the correction values by summing to form an output.

25. The method of claim 14 or 24 wherein summing comprises averaging.

* * * * *